United States Patent
Tomita et al.

(10) Patent No.: US 7,138,700 B2
(45) Date of Patent: Nov. 21, 2006

(54) SEMICONDUCTOR DEVICE WITH GUARD RING FOR PREVENTING WATER FROM ENTERING CIRCUIT REGION FROM OUTSIDE

(75) Inventors: Ryuji Tomita, Kanagawa (JP); Tetsuya Kurokawa, Kanagawa (JP); Takashi Ishigami, Kanagawa (JP); Manabu Iguchi, Kanagawa (JP); Kazuyoshi Ueno, Kanagawa (JP); Makoto Sekine, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 10/807,239

(22) Filed: Mar. 24, 2004

(65) Prior Publication Data

US 2004/0195582 A1    Oct. 7, 2004

(30) Foreign Application Priority Data

Apr. 1, 2003  (JP) ............................. 2003-098163

(51) Int. Cl.
*H01L 29/00* (2006.01)

(52) U.S. Cl. ..................................... 257/529; 257/758
(58) Field of Classification Search ............... 257/529, 257/758
See application file for complete search history.

(56) References Cited

U.S. PATENT DOCUMENTS

2001/0038138 A1 * 11/2001 Mites et al. ................. 257/544
2003/0160262 A1 *  8/2003 Kitada et al. ............... 257/127

FOREIGN PATENT DOCUMENTS

JP         9-45766      2/1997

* cited by examiner

*Primary Examiner*—Long Pham
(74) *Attorney, Agent, or Firm*—Young & Thompson

(57) ABSTRACT

A semiconductor device has a first guard ring surrounding a circuit region, a second ring disposed between the circuit region and the first guard ring, and first connections connecting the first guard ring and the second guard ring to each other. An area sandwiched between the first guard ring and the second guard ring is divided by the first connections into a plurality of subareas. Even if the first guard ring is partly defective, water enters from outside into only the subarea which is contiguous to the defective part of the first guard ring.

18 Claims, 14 Drawing Sheets a circuit region · a guard ring region

SEMICONDUCTOR DEVICE WITH GUARD RING FOR PREVENTING WATER FROM ENTERING CIRCUIT REGION FROM OUTSIDE

BACKGROUND OF THE INVENTION

1. Field of the Invention

The present invention relates to a semiconductor device having a circuit region where semiconductor components such as transistors or the like are formed.

2. Description of the Related Art

Heretofore, semiconductor devices have had a circuit region where circuits such as memories, logic circuits, etc., are formed, and a guard ring for preventing water from entering the circuit region from the surrounding area. The guard ring extends along the periphery of the chip and is made of a metal such as copper (Cu) or the like. One known guard ring is disclosed in Japanese Patent Laid-open Publication No. 45766/97, for example, as follows: A semiconductor device has an outer guard ring disposed near the periphery of a chip and an inner guard ring disposed between the outer guard ring and a circuit region. The outer guard ring and the inner guard ring jointly make up a double guard ring assembly. The double guard ring assembly is advantageous in that even if the outer guard ring is defective, allowing water to enter a region inward of the outer guard ring from outside of the chip, the inner guard ring prevents the water from entering the circuit region.

However, the double guard ring assembly is a mere combination of two guard rings. Therefore, when water happens to enter a region inward of the outer guard ring from outside of the chip through a defect in the outer guard ring, if the inner guard ring has a defect somewhere therein, the water finds its way through the defect in the inner guard ring into the circuit region, tending to corrode circuit interconnections in the circuit region.

SUMMARY OF THE INVENTION

It is therefore an object of the present invention to provide a semiconductor device which is more effective to prevent water from entering a circuit region for increased reliability.

According to the present invention, a semiconductor device has a first guard ring surrounding a circuit region, a second ring disposed between the circuit region and the first guard ring, and first connections connecting the first guard ring and the second guard ring to each other and dividing an area sandwiched between the first guard ring and the second guard ring into a plurality of subareas. Since the area sandwiched between the first guard ring and the second guard ring is divided by the first connections into a plurality of subareas, even if the first guard ring is partly defective, water enters from outside into only the subarea which is contiguous to the defective part of the first guard ring.

The first connections may connect a corner of the second guard ring which corresponds to a corner of the circuit region to the first guard ring. With this arrangement, when the semiconductor device is scribed so as to be severed into chips, even if the corner of a chip is broken, water from outside finds its way only into the subarea at the corner of the second guard ring and is prevented from entering other subareas.

The connections may be spaced at a density which is progressively greater toward a corner of the circuit region. When the semiconductor device is scribed, a chip corner tends to be broken. Inasmuch as the volume of subareas between the connections is progressively smaller toward the chip corner, any water that has entered is blocked in a subarea having a smaller volume and is prevented from being introduced into subareas having larger volumes.

The semiconductor device may also include a third guard ring disposed between the second guard ring and the circuit region, and second connections connecting the second guard ring and the third guard ring to each other. Since the semiconductor device has three guard rings, even if the second guard ring has a fault near a subarea where water has entered, the water is prevented by the third guard ring from entering the circuit region.

Furthermore, junctions where the first connections are connected to the second guard ring and junctions where the second connections are connected to the second guard ring may be positioned out of alignment with each other. With this arrangement, the embeddability of a metal in the junctions is increased for making the semiconductor device more effective to prevent water from entering the circuit region.

According to the present invention, the semiconductor device has two or more guard rings which are connected to each other by connections that divide the area between the guard rings into a plurality of subareas. Even if the guard rings are partly broken due to chipping or interlaminar film peel-off or are partly defective, water from outside finds its way into one of the subareas, but is prevented from entering other subareas and hence from entering the circuit region. Accordingly, any corrosion caused due to water introduced into a subarea contiguous to the broken or defective part of the guard rings is restricted to that subarea, and is prevented from spreading to the entire circuit region.

The above and other objects, features, and advantages of the present invention will become apparent from the following description with reference to the accompanying drawings which illustrate examples of the present invention.

DETAILED DESCRIPTION OF THE PREFERRED EMBODIMENTS

1st Embodiment

Figure 1A:
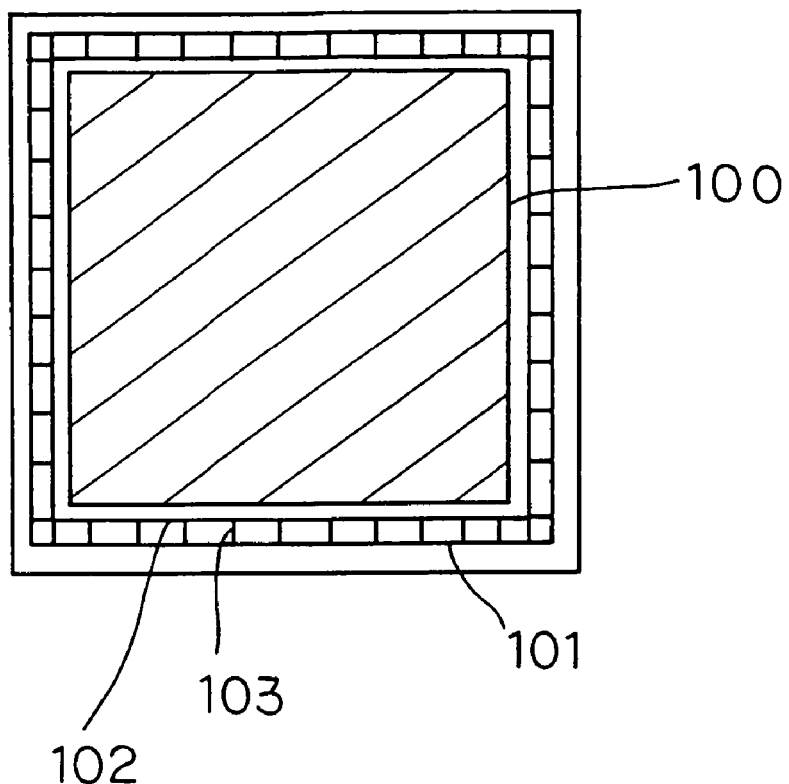
FIGS. 1A and 1B are plan views of a semiconductor device according to a first embodiment of the present invention.
Figure 1B:
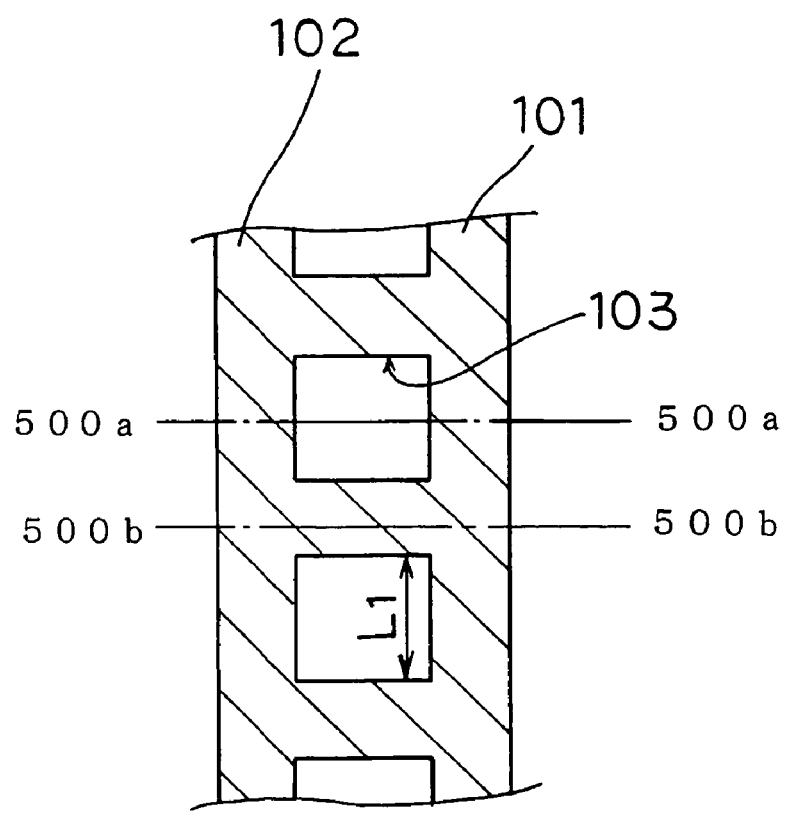

FIG. 1A shows in plan a semiconductor device according to a first embodiment of the present invention, and FIG. 1B shows in enlarged fragmentary plan a guard ring assembly of the semiconductor device according to the first embodiment.

As shown in FIG. 1A, the semiconductor device according to the first embodiment comprises circuit region 100 circuits such as memories, logic circuits, etc., are formed, two guard rings 101, 102 extending along the periphery of the chip, and a plurality of connections 103 interconnecting two guard rings 101, 102. Guard ring 101 is disposed closely to the periphery of the chip, and guard ring 102 is disposed between guard ring 101 and circuit region 100.

As shown in FIG. 1B, two guard rings 101, 102 are interconnected by connections 103 that are spaced at predetermined intervals. Connections 103 divide the area sandwiched between two guard rings 101, 102 into a plurality of subareas. In FIG. 1B, two adjacent connections 103 are spaced from each other by a distance $L_1$ of 1.9 μm.

With the semiconductor device shown in FIGS. 1A and 1B, even if guard ring 101 is partly broken due to chipping or interlaminar film peel-off which may occur at a chip end when the semiconductor device is scribed, since the area sandwiched between two guard rings 101, 102 is divided into the subareas by connections 103, water that finds its way through the broken portion of guard ring 101 enters only the subarea contiguous to the broken portion of guard ring 101. In addition, even if guard ring 101 is partly defective, water that finds its way through the defective portion of guard ring 101 enters only the subarea contiguous to the defective portion of guard ring 101. Therefore, even if guard ring 102 has a defect in a portion thereof that is not contiguous to the subarea which the water has entered, the water is prevented from being introduced into circuit region 100.

Cross-sectional structural details of the guard ring assembly of the semiconductor device according to the first embodiment will be described below.

Figure 2A:
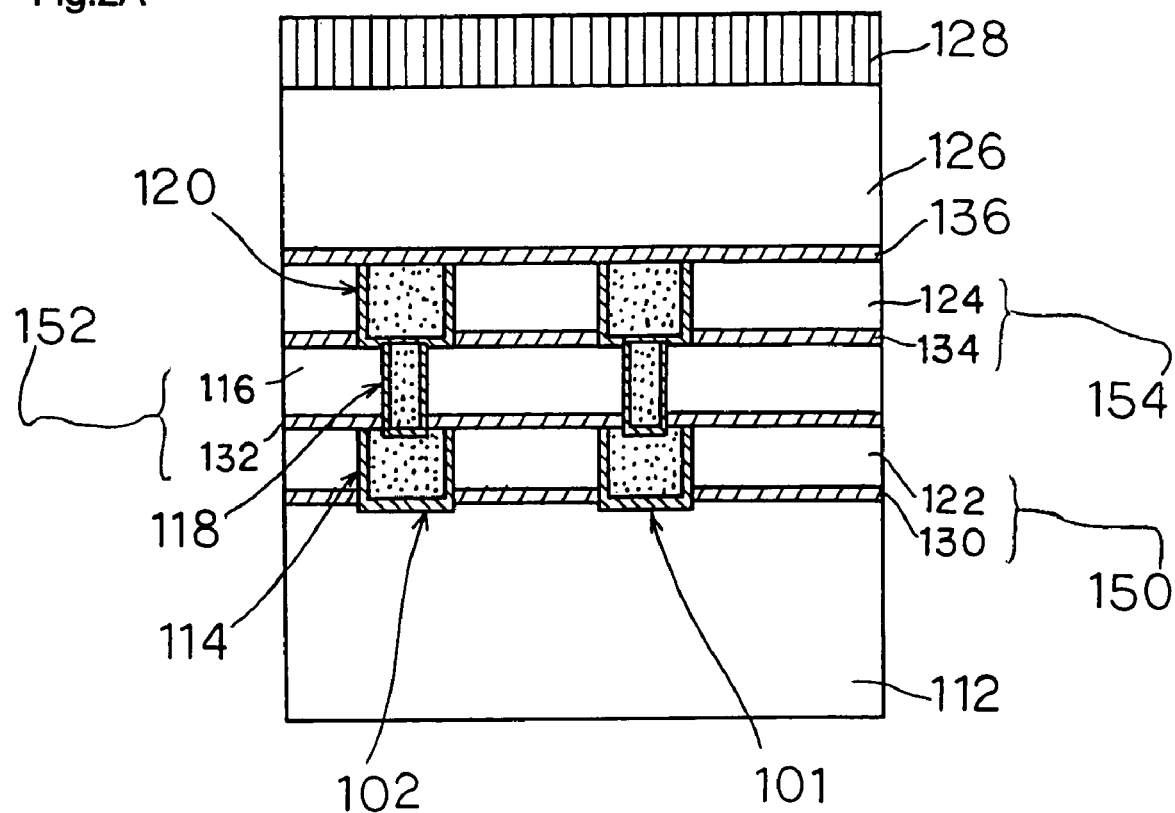
FIGS. 2A and 2B are cross-sectional views of a guard ring assembly of the semiconductor device according to the first embodiment.
Figure 2B:
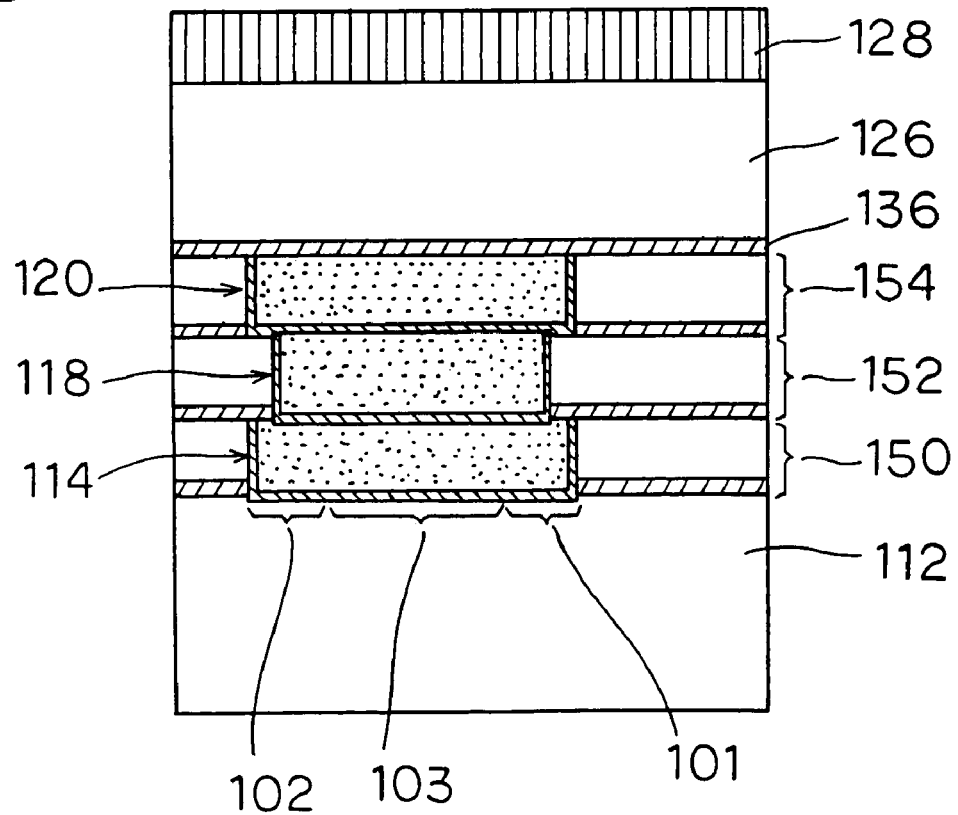

FIGS. 2A and 2B show in cross section the guard ring assembly of the semiconductor device according to the first embodiment. FIG. 2A is a cross-sectional view taken along line 500a—500a of FIG. 1B, and FIG. 2B is a cross-sectional view taken along line 500b—500b of FIG. 1B.

As shown in FIG. 2A, each of guard rings 101, 102 has guard ring interconnection 114, slit via plug 118, and guard ring interconnection 120 which are successively formed on oxide film ($SiO_2$ film) 112 which serves as a base insulating film on a semiconductor substrate (not shown). Guard ring interconnection 114 and guard ring interconnection 120 are connected to each other by slit via plug 118. Slit via plug 118 is formed along guard ring interconnections 114, 120 and has a width which is the same as the diameter of via plugs formed in circuit region 100 for better embeddability of metal in slit via plug 118.

Guard ring interconnection 114 is disposed in interlaminar insulating film 150. Interlaminar insulating film 150 comprises SiCN film 130 serving as a stopper film for stopping etching and $SiO_2$ film 122 disposed on SiCN film 130. Slit via plug 118 is formed in interlaminar insulating film 152. Interlaminar insulating film 152 comprises SiCN film 132 and ladder oxide film (hereinafter referred to as "L-Ox film") 116 which is disposed on SiCN film 132 as a film having a lower dielectric constant than an $SiO_2$ film. Guard ring interconnection 120 is disposed in interlaminar insulating film 154. Interlaminar insulating film 154 comprises SiCN film 134 and L-Ox film 124 disposed on SiCN film 134. SiCN film 136, $SiO_2$ film 126, and SiON film 128 are successively disposed on guard ring interconnection 120.

The film having the lower dielectric constant (lower-dielectric-constant film) is used in the interlaminar insulating film in order to reduce the capacitance between interconnections in circuit region 100. L-Ox film 116 comprises a film having a ladder-type hydrogenated siloxane structure. "L-Ox" is a registered trademark of NEC Electronics Corporation.

Cross-sectional structural details of connections 103 will be described below.

As shown in FIG. 2B, each of connections 103 has guard ring interconnection 114, slit via plug 118, and guard ring interconnection 120 which are successively formed, and is integral with guard rings 101, 102.

Guard ring 101, guard ring 102, and connections 103 are thus formed to cover not only sides of the lower-dielectric-constant films but also a slit between the lower-dielectric-constant films and other insulating films such as oxide films. The reasons why guard ring 101, guard ring 102, and connections 103 are thus formed are that since the sides of the lower-dielectric-constant films but also the interfaces between the lower-dielectric-constant films and other insulating films are more susceptible to the entry of water than oxide films, guard ring 101, guard ring 102, and connections 103 are applied to prevent water from entering circuit region 100 through those sides and interfaces.

Connections 103 are formed to the same depth as guard rings 101, 102. Therefore, even if water is introduced into one of the subareas sandwiched between guard rings 101, 102, connections 103 can prevent the water from entering from that subarea into subareas adjacent thereto.

Semiconductor components such as transistor components, resistive components, and capacitive components are formed on the semiconductor substrate in circuit region 100, and $SiO_2$ film 112 which will serve as a base insulating film on the semiconductor substrate. Interconnections and via plugs (not shown) are connected on $SiO_2$ film 112 for desired circuit operation.

A method of manufacturing the semiconductor device of the above construction will be described below.

FIGS. 3A through 3I are cross-sectional views showing a process of manufacturing the semiconductor device according to the first embodiment. Each of FIGS. 3A through 3I show a circuit region and a guard ring region separately from each other.

Figure 3A:
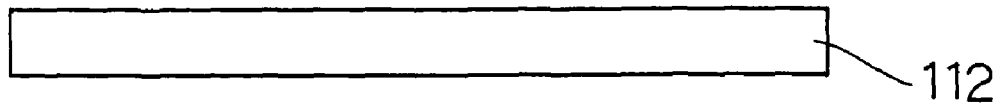
FIGS. 3A through 3I are cross-sectional views showing a method of manufacturing the semiconductor device according to the first embodiment.
Figure 3B:
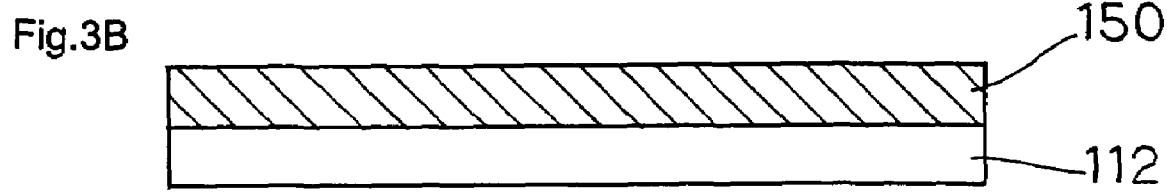

After semiconductor components (not shown) have been formed in the circuit region on the semiconductor substrate, $SiO_2$ film 112 is formed (see FIG. 3A). Then, an SiCN film and an $SiO_2$ film are successively formed on $SiO_2$ film 112, thus producing interlaminar insulating film 150 which is made up of the SiCN film and the $SiO_2$ film (see FIG. 3B).

Figure 3C:
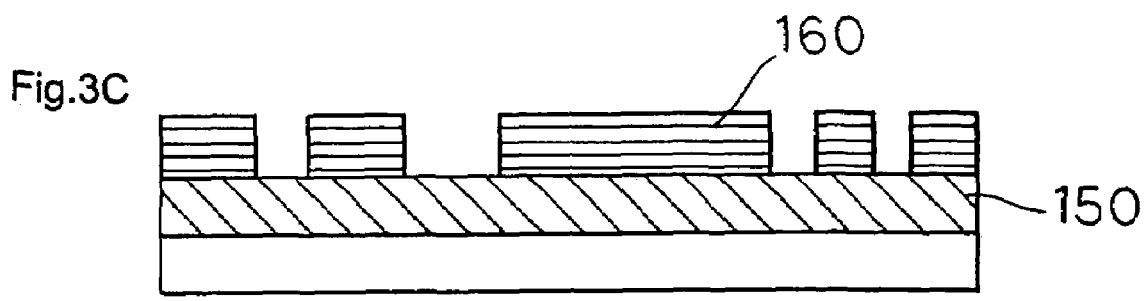

Then, a pattern of resist film 160 having openings for forming grooves to produce interconnections is formed on interlaminar insulating film 150 by a known lithographic process (see FIG. 3C).

Figure 3D:
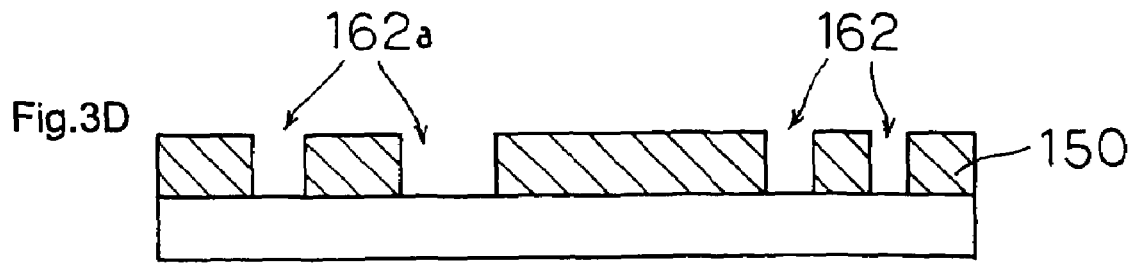
Figure 3E:
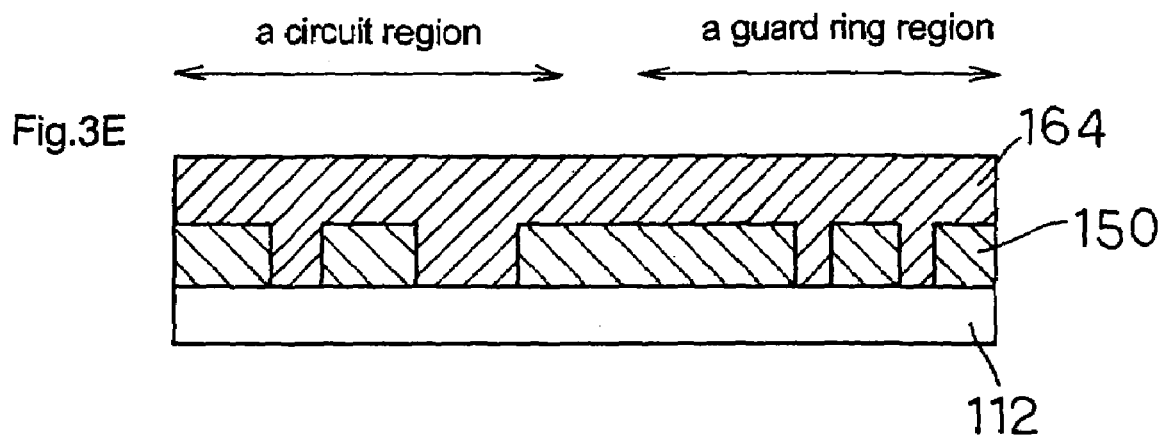
Figure 3F:
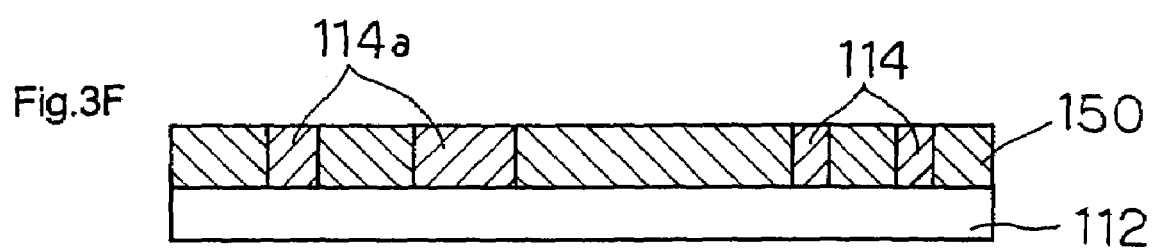
Figure 3G:
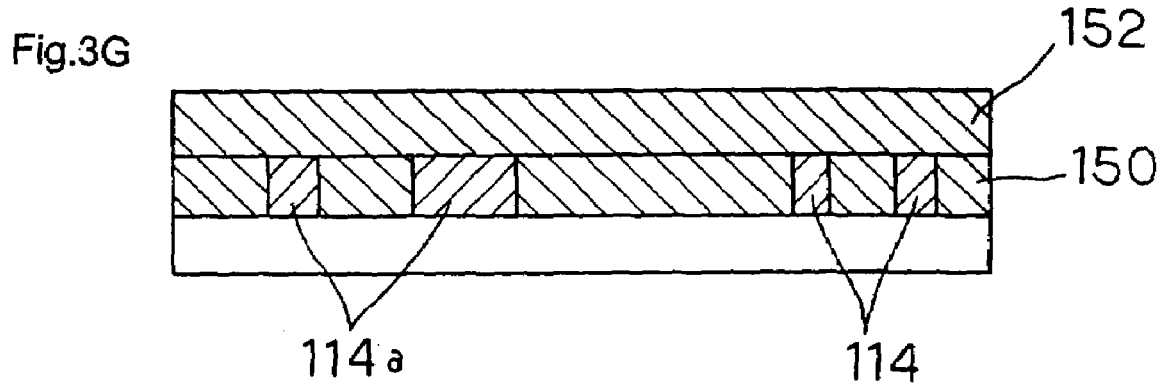

As shown in FIG. 3D, the assembly is subjected to anisotropic etching to remove the SiCN film and the $SiO_2$ film of interlaminar insulating film 150 in the openings of resist film 160. After circuit interconnection grooves 162a are thus formed in the circuit region and guard ring interconnection grooves 162 are thus formed in the guard ring region, resist film 160 is removed. Thereafter, a seed layer of Cu is formed, and Cu film 164 is formed by electrolytic plating (see FIG. 3E).

Figure 4A:
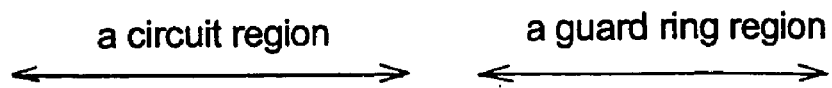
FIGS. 4A through 4G are cross-sectional views showing another method of manufacturing the semiconductor device according to the first embodiment.
Figure 4A:
Figure 4B:
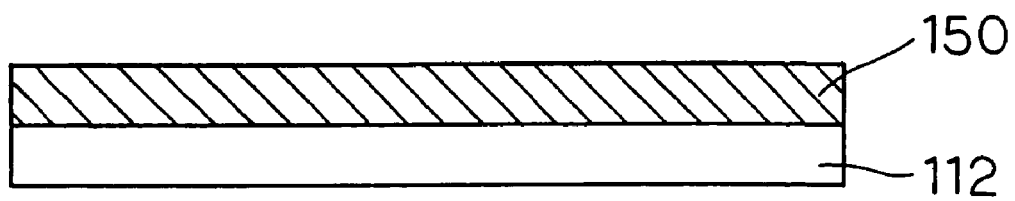
Figure 4C:
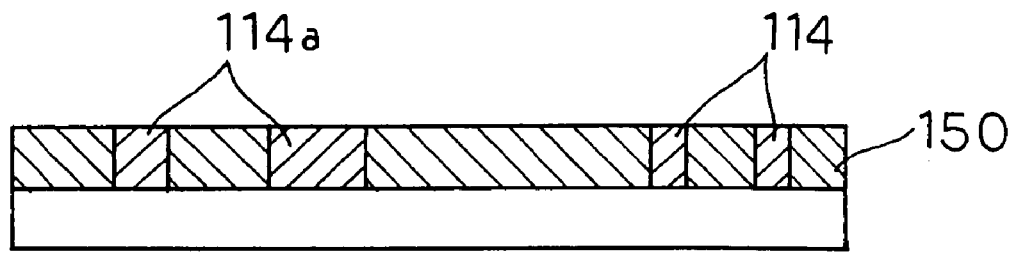
Figure 4D:
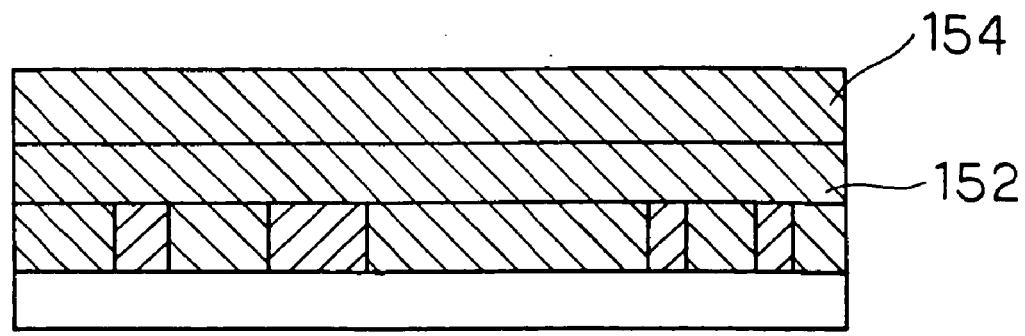
Figure 4E:
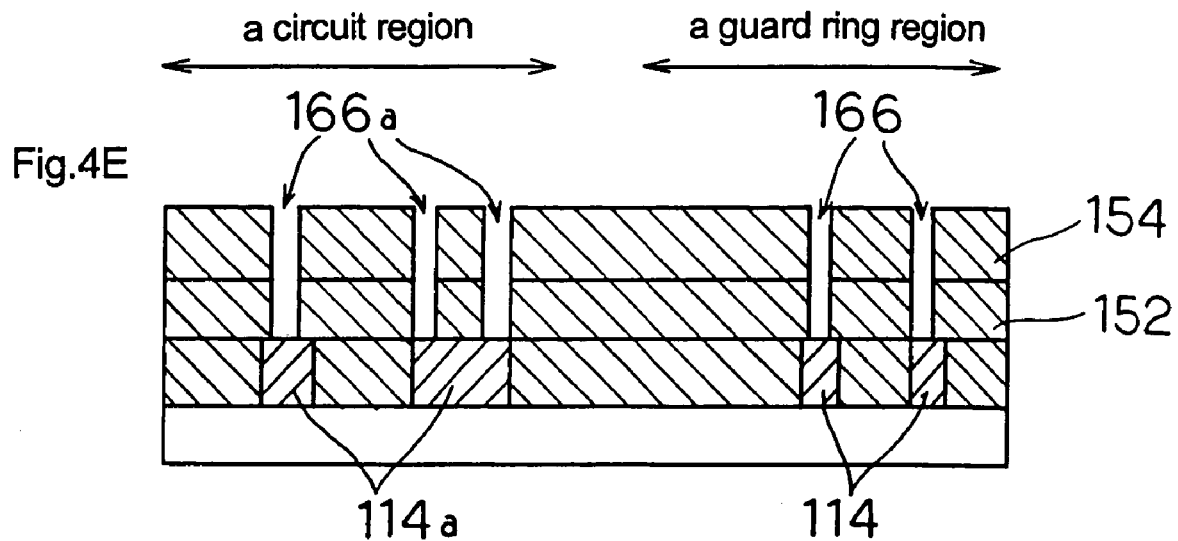
Figure 4F:
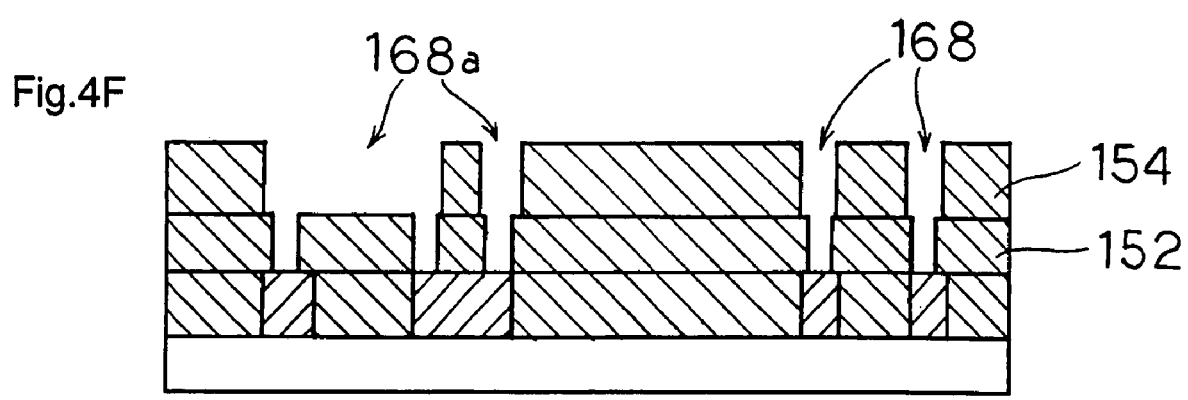
Figure 4G:
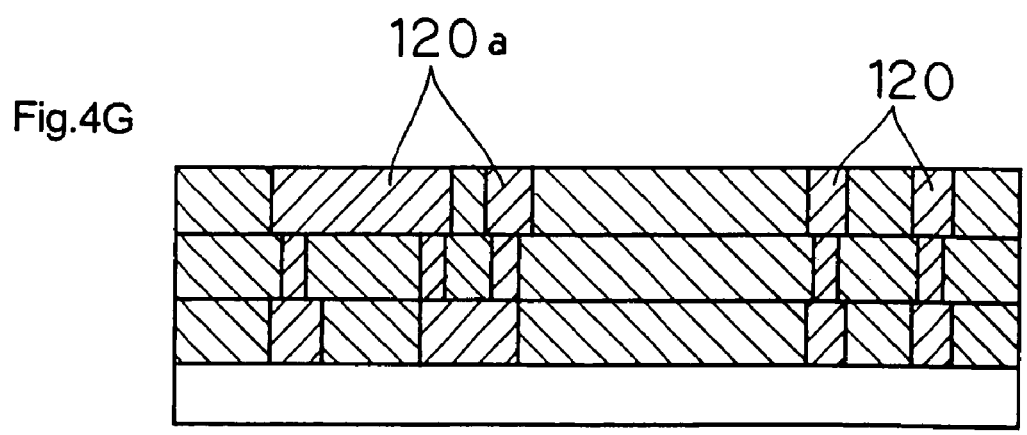

As shown in FIG. 4F, Cu film 164 is polished by CMP (Chemical Mechanical Polishing) until the upper surface of interlaminar insulating film 150 is exposed, thereby forming circuit interconnections 114a and guard ring interconnections 114. Then, interlaminar insulating film 152 having an SiCN film and an L-Ox film is deposited on the surface formed so far (see FIG. 3G).

Figure 3H:
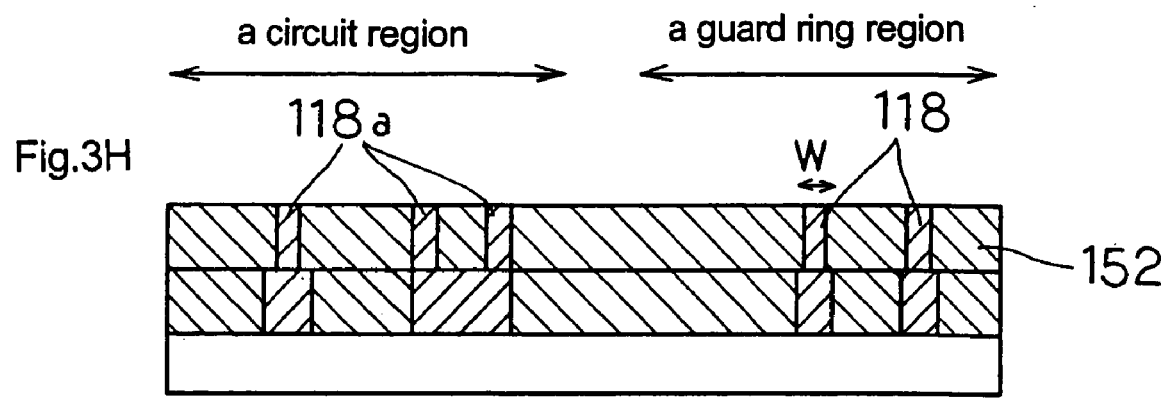

Thereafter, as shown in FIG. 3H, circuit via plugs 118a and guard ring slit via plugs 118 are formed respectively in the circuit region and the guard ring region in the same manner as the above process of forming circuit interconnections 114a and guard ring interconnections 114. Slit via plugs 118 in the guard ring region have width W which is equal to the diameter of circuit via plugs 118a in order to allow Cu to be embedded sufficiently in slit via plugs 118. With such a width selection, the metal can be embedded well in slit via plugs 118 to make slit via plugs 118 more effective to prevent water from entering therethrough.

Figure 3I:
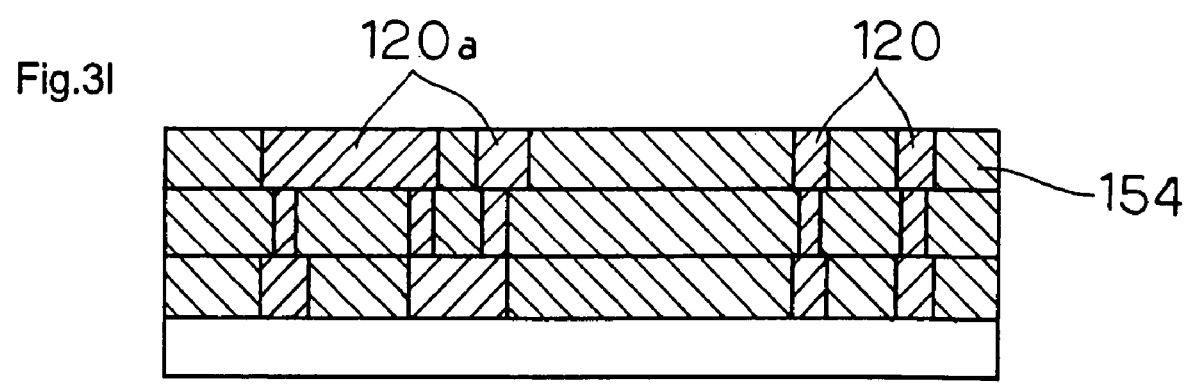

Thereafter, as shown in FIG. 3I, interlaminar insulating film 154 having an SiCN film and an L-Ox film is deposited on the surface formed so far. Then, circuit interconnections 120a and guard ring interconnections 120 are formed respectively in the circuit region and the guard ring region in the same manner as the above process of forming circuit interconnections 114a and guard ring interconnections 114. Then, $SiO_2$ film 126 and SiON film 128 are formed to produce the structure shown in FIG. 2A.

As described above, guard rings 101, 102 and connections 103 can be formed by a single damascene process wherein interconnections and via plugs are formed separately from each other.

A method of manufacturing the semiconductor device according to a dual damascene process which is simpler than the single damascene process will be described below.

FIGS. 4A through 4G are cross-sectional views showing another method of manufacturing the semiconductor device. Each of FIGS. 4A through 4G show a circuit region and a guard ring region separately from each other.

After semiconductor components (not shown) have been formed in the circuit region on the semiconductor substrate in the same manner as the single damascene process described above, $SiO_2$ film 112 is formed (see FIG. 4A). Then, interlaminar insulating film 150 made up of an SiCN film and an $SiO_2$ film is on $SiO_2$ film 112 (see FIG. 4B). Then, circuit interconnections 114a and guard ring interconnections 114 are formed respectively in the circuit region and the guard ring region in the same manner as the processing sequence described above with reference to FIGS. 3C through 3F (see FIG. 4C). Then, interlaminar insulating film 152 and interlaminar insulating film 154 are successively deposited on the surface formed so far (see FIG. 4D). Then, a pattern of resist film having openings for producing interconnections is formed on interlaminar insulating film 154 by a known lithographic process. Thereafter, the assembly is subjected to anisotropic etching to remove interlaminar insulating film 152 and interlaminar insulating film 154 in the openings until circuit interconnections 114a and guard ring interconnections 114 have their upper surfaces exposed. Then, the resist film is removed, and, as shown in FIG. 4E, circuit via holes 166a and slit via holes 166 are formed respectively in the circuit region and the guard ring region.

Thereafter, a pattern of resist film having openings for producing interconnections is formed on the surface by a known lithographic process, and interlaminar insulating film 154 in the openings is removed by anisotropic etching. Then, the resist film is removed, as shown in FIG. 4F, circuit interconnection grooves 168a and guard ring interconnection grooves 168 are formed respectively in the circuit region and the guard ring region.

After a seed layer of Cu is formed, a Cu film is formed by electrolytic plating. Thereafter, the Cu film is polished by CMP until the upper surface of interlaminar insulating film 154 is exposed, thereby forming circuit interconnections 120a in the circuit region and guard ring interconnections 120 in the guard ring region. Then, $SiO_2$ film 126 and SiCN film 128 are successively deposited on circuit interconnections 120a and guard ring interconnections 120 to produce the structure shown in FIG. 2A.

In this manner, the semiconductor device of the above structure can be fabricated according to the dual damascene process. The above dual damascene process is a via-first process wherein slit via plugs 166 are formed first. However, a trench-first process wherein guard ring interconnections 168 are formed first may be employed.

A dual hard mask process may also be employed as another dual damascene process. The dual hard mask process will briefly be described below with respect to the guard ring region. After interlaminar insulating film 154 shown in FIG. 4D has been formed, an SiC film as via holes forming mask film and an $SiO_2$ film as interconnection grooves forming mask film are successively formed thereon. Interconnection groove patterns are formed in the $SiO_2$ film and then via hole patterns are formed in the SiC film according to known lithography and etching. Thereafter, using the $SiO_2$ film and the SiC film as masks, interlaminar insulating film 152 and interlaminar insulating film 154 are etched, after which the SiC film and interlaminar insulating film 154 are etched using the $SiO_2$ film as a mask, thus forming slit via holes 166 shown in FIG. 4E and guard ring interconnection grooves 168 shown in FIG. 4F. According to this process, interlaminar insulating film 152 and interlaminar insulating film 154 are free from ashing damage when the resist film is removed in lithography.

With the semiconductor device shown in FIG. 1A, circuit region 100 and the chip are of a square shape having four corners. Each of guard ring 101 and guard ring 102 also has four corners as they extend along the periphery of the chip. With the semiconductor device shown in FIGS. 1A and 1B, connections 103 are disposed at equally spaced intervals. However, connections 103 may be disposed at least at the corners of guard ring 102 as described below.

Figure 5:
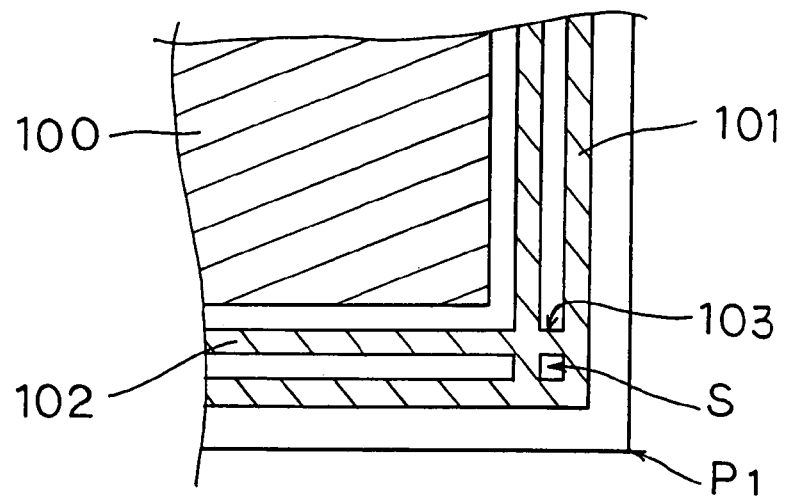
FIG. 5 is an enlarged plan view showing connections disposed at corners of guard rings.

FIG. 5 shows in enlarged plan connections 103 disposed at corners of guard ring 102.

When the semiconductor device is scribed so as to be severed into chips, point $P_1$ on a corner of the chip shown in FIG. 5 is most likely to become defective as scribing shocks are applied twice to point $P_1$. However, as shown in FIG. 5, since connections 103 are disposed at the corner of guard ring 102 and connected to guard ring 101, even if the corner is broken due to scribing shocks and water finds its way into subarea S, the water is prevented by connections 103 from entering other subareas.

In addition, connections may be provided at a density that is progressively greater toward a chip corner as described below.

Figure 6:
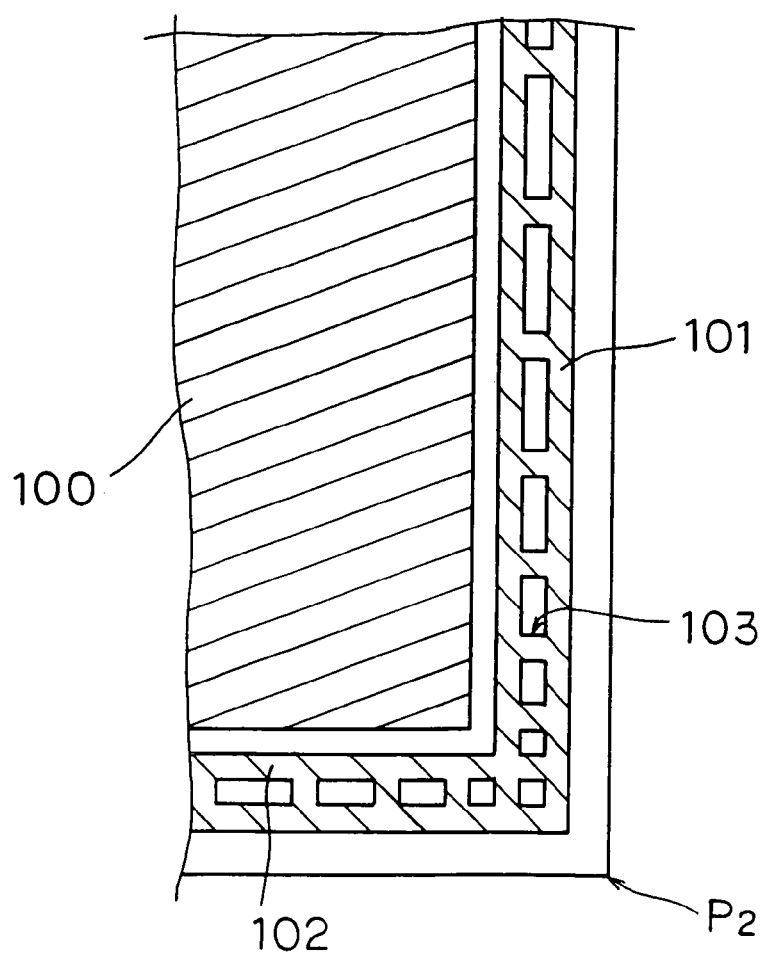
FIG. 6 is an enlarged plan view showing connections provided at a density that is progressively greater toward corners of guard rings.

FIG. 6 shows in enlarged plan connections provided at a density that is progressively greater toward a chip corner. As shown in FIG. 6, connections 103 are disposed at a spaced interval that is progressively greater, e.g., 1.0 times, 1.7 times, 2.3 times, and 3 times, toward a midpoint on a side of the chip in an upward direction from point $P_2$. Similarly, connections 103 are disposed at a spaced interval that is progressively greater toward a midpoint on a side of the chip in a leftward direction from point $P_2$.

Inasmuch as the density of connections 103 is progressively greater toward the chip corner, the volume of subareas between connections 103 is progressively smaller toward the chip corner. If the chip corner is broken due to scribing shocks, any water that has entered is blocked in a subarea having a smaller volume and is prevented from being introduced into subareas having larger volumes. Because the possibility of breakage at the periphery of the chip near subareas having larger volumes is reduced, the arrangement shown in FIG. 6 is effective to prevent water from entering inside of guard ring 102.

2nd Embodiment

A semiconductor device according to a second embodiment of the present invention has three or more guard rings.

Those parts of the semiconductor device according to the second embodiment which are identical to those of the semiconductor device according to the first embodiment are denoted by identical reference characters, and will not be described in detail below.

Figure 7A:
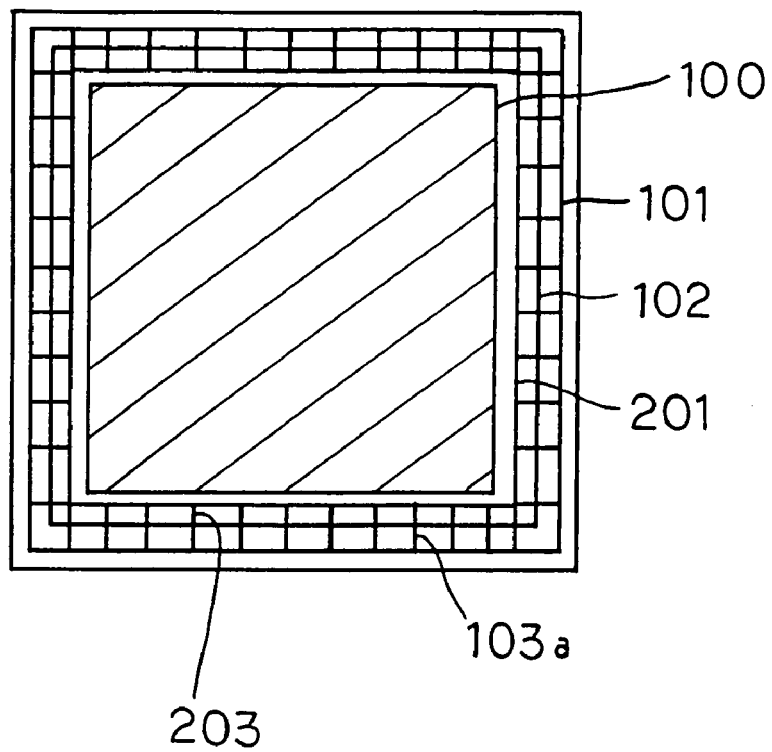
FIGS. 7A and 7B are plan views of a semiconductor device according to a second embodiment of the present invention.
Figure 7B:
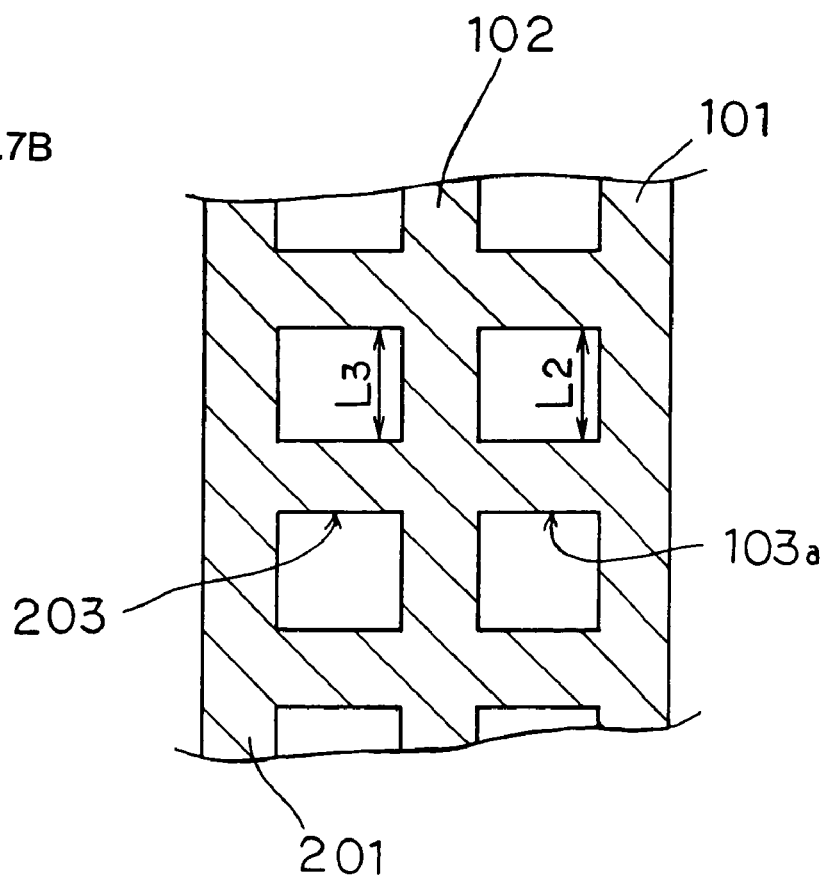

FIG. 7A shows in plan the semiconductor device according to the second embodiment of the present invention, and FIG. 7B shows in enlarged fragmentary plan guard rings of the semiconductor device according to the second embodiment.

As shown in FIG. 7A, the semiconductor device according to the second embodiment has guard ring 201 disposed between guard ring 102 and circuit region 100 of the semiconductor device according to the first embodiment, and hence has three guard rings. Guard rings 101, 102 are connected to each other by a plurality of connections 103a, and guard rings 102, 201 are connected to each other by a plurality of connections 203.

As shown in FIG. 7B, connections 203 divide the area sandwiched between guard rings 102, 201 into a plurality of subareas. Two adjacent connections 103a are spaced from each other by a distance $L_2$ of 1.9 µm, and two adjacent connections 203 are spaced from each other by a distance $L_3$ of 1.9 µm.

In the present embodiment, junctions where connections 103a are connected to guard ring 102 and junctions where connections 203 are connected to guard ring 102 are aligned with each other. Each point where the junctions are aligned with each other is of a crisscross shape having four linear patterns extending in different directions. If the number of linear patterns connected in different directions at the junctions where the guard ring and the connections are connected to each other is represented by n (n is a natural number of 2 or greater), then since the junctions serve as a point where n linear patterns are connected, the junctions are referred to as n-joint point. In the arrangement shown in FIG. 7B, since the number of connected linear patterns is 4, the junction is referred to as a 4-joint point.

Since there are three guard rings in the semiconductor device according to the second embodiment, even if guard ring 102 has a fault near a subarea where water has entered, guard ring 201 is effective to prevent the water from being introduced into circuit region 100.

3rd Embodiment

A semiconductor device according to a third embodiment of the present invention has three or more guard rings. The semiconductor device according to the third embodiment is similar to the semiconductor device according to the second embodiment except that the junctions between connections 103a and guard ring 102 and the junctions between connections 203 and guard ring 102 are positioned out of alignment with each other.

Those parts of the semiconductor device according to the third embodiment which are identical to those of the semiconductor devices according to the first and second embodiments are denoted by identical reference characters, and will not be described in detail below.

Figure 8A:
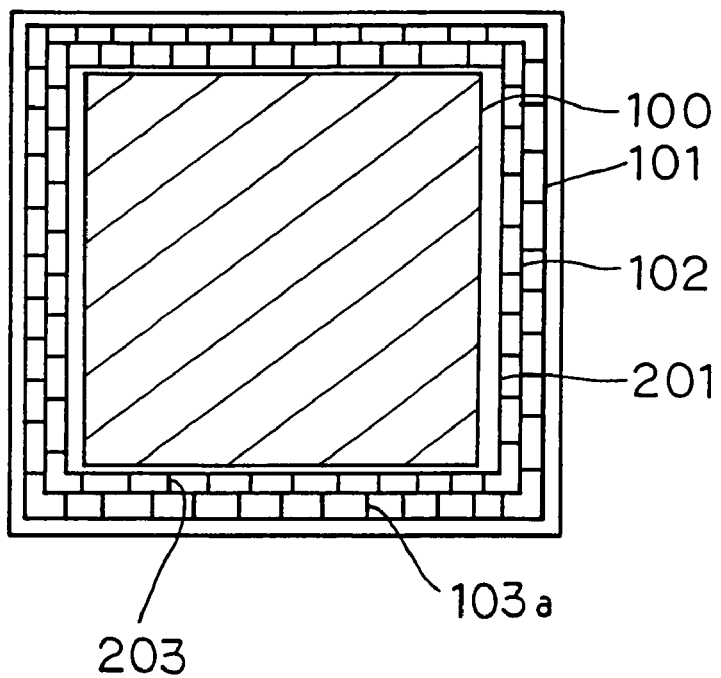
FIGS. 8A and 8B are plan views of a semiconductor device according to a third embodiment of the present invention.
Figure 8B:
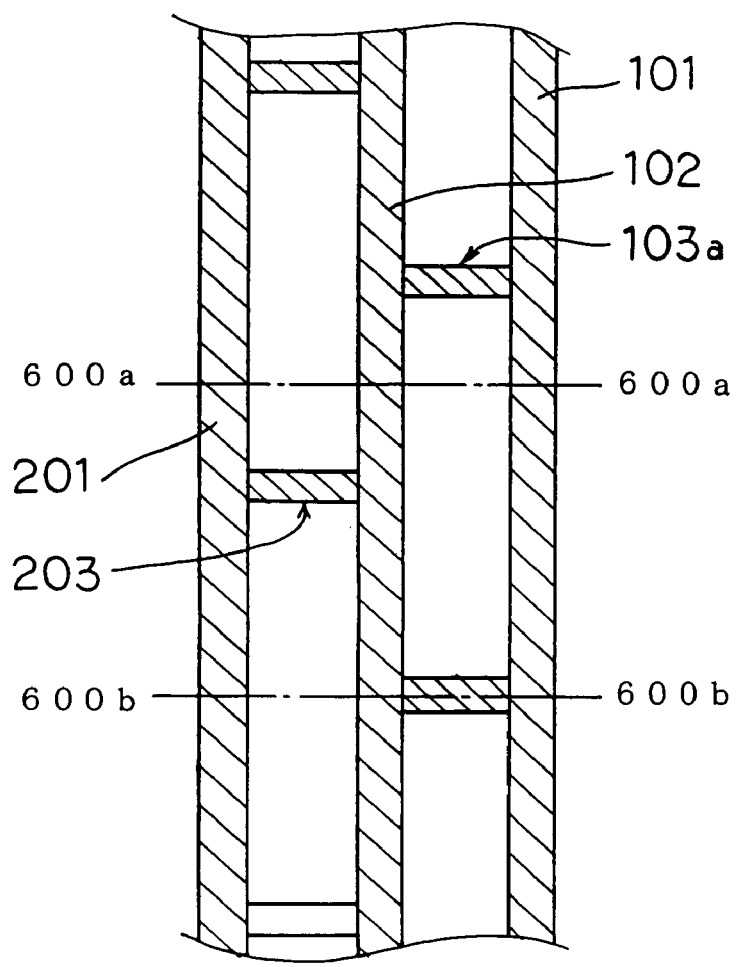

FIG. 8A shows in plan the semiconductor device according to the third embodiment of the present invention, and FIG. 8B shows in enlarged fragmentary plan guard rings of the semiconductor device according to the third embodiment.

As shown in FIG. 8A, guard ring 201 is disposed between guard ring 102 and circuit region 100, as with the second embodiment. Guard rings 101, 102 are connected to each other by a plurality of connections 103a, and guard rings 102, 201 are connected to each other by a plurality of connections 203.

As shown in FIG. 8B, junctions where connections 103a are connected to guard ring 102 and junctions where connections 203 are connected to guard ring 102 are positioned out of alignment with each other. Each junction between a guard ring and a connection serves as a 3-joint point. Therefore, guard ring 102 according to the third embodiment does not have any points where the number of connected linear patterns is 4 or more.

The embeddability of Cu in a junction between a guard ring and a connection will be described below.

Figure 9A:
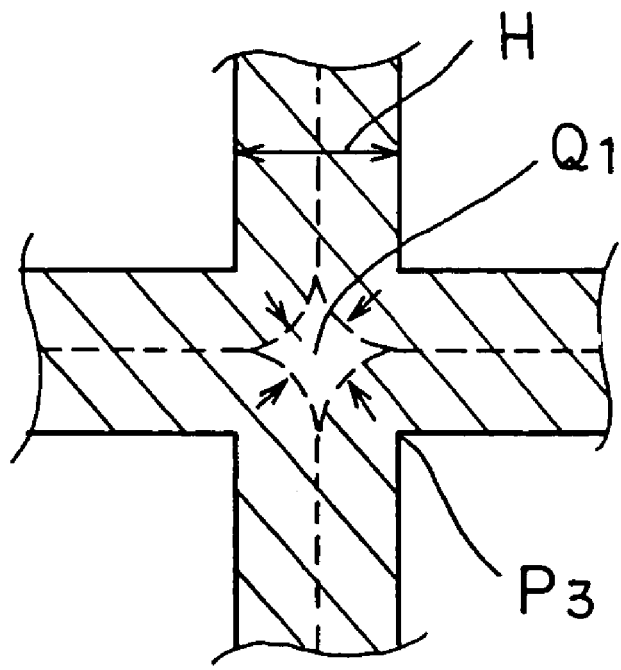
FIGS. 9A and 9B are plan views showing a Cu film growth process at a junction.
Figure 9B:
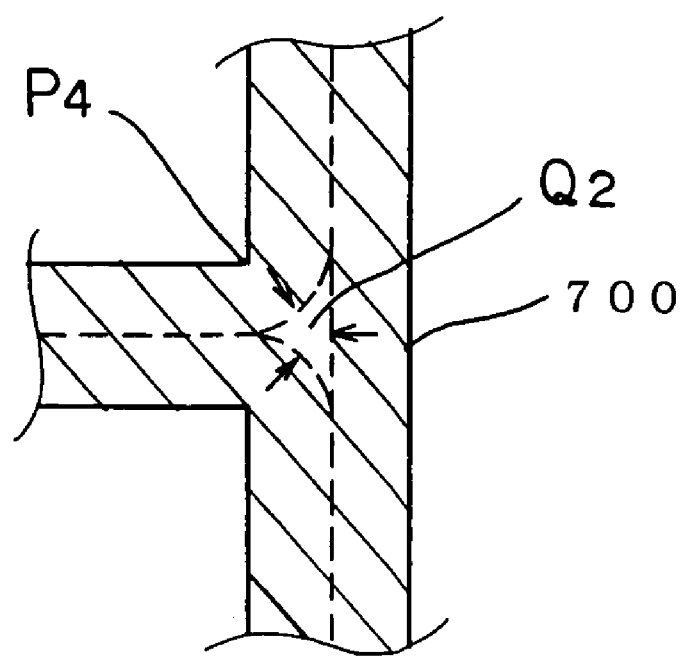

FIGS. 9A and 9B show in plan a Cu film growth process at a junction at the time guard ring interconnection 114 is formed. FIG. 9A shows a junction in the arrangement illustrated in FIG. 7B, and FIG. 9B shows a junction in the arrangement illustrated in FIG. 8B. In FIGS. 9A and 9B, the broken lines represent a Cu film surface during a Cu film growth, and the arrows represent the directions of growth of a Cu film.

Since a Cu film starts growing from side walls of a groove, if the junctions are of a crisscross shape as shown in FIG. 9A, then in order to embed a film up to a central point $Q_1$ which is the remotest from groove side wall corner $P_3$, a Cu film needs to be formed to a thickness that is about 1.4 times the thickness required to embed interconnection H in the groove. If the junction is of a T shape as shown in FIG. 9B, then since a Cu film grows from groove side wall 700, a film can be embedded to a central point $Q_2$ which is the remotest from groove side wall corner $P_4$ even though the film thickness of Cu that needs to be formed may be smaller than with the structure shown in FIG. 9A. Thus, the T-shaped junction between a guard ring and a connection allows a metal to be embedded in the junction more easily than the crisscross-shaped junction, for making the guard ring and the connection more effective in preventing water from entering the circuit region.

While the Cu film growth process at a junction at the time guard ring interconnection 114 is formed has been described above, the same Cu film growth process is applicable to the formation of a via plug layer and an interconnection layer. If a guard ring has a 5-joint point, then the film thickness of Cu that needs to be formed to embed Cu in the junction is larger than if the number of connected linear patterns at the junction is 4 or less.

Therefore, if guard ring 102 is free of junctions where the number of connected linear patterns is 4 or more, then the embeddability of a Cu film in junctions is better for a higher sealing capability at the junctions.

Cross-sectional structures of guard rings of the semiconductor device according to the third embodiment of the present invention will be described below.

Figure 10A:
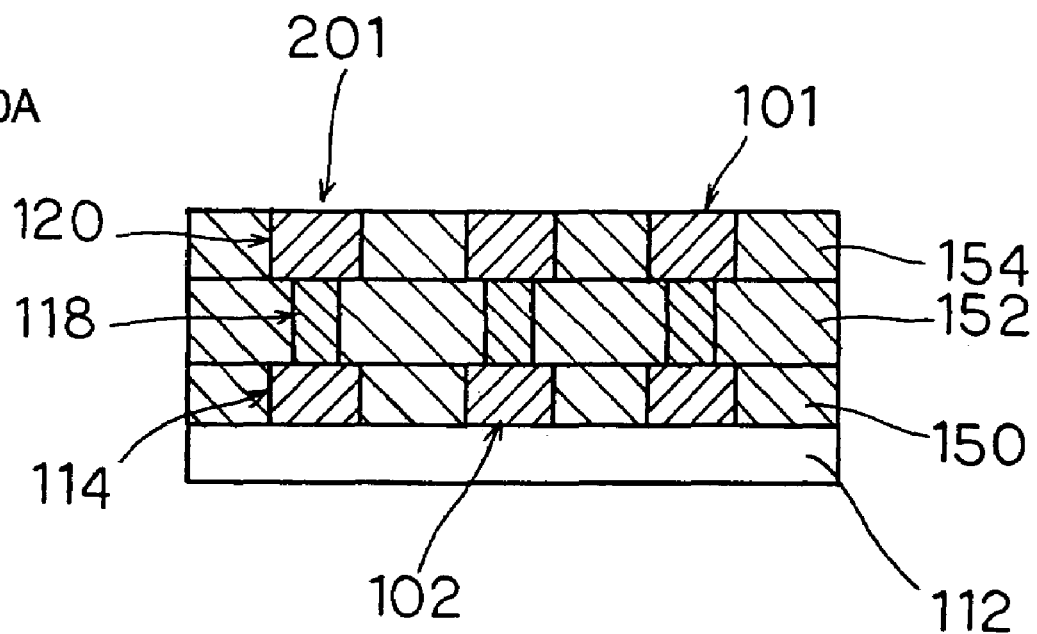
FIGS. 10A and 10B are cross-sectional views of a guard ring assembly of the semiconductor device according to the third embodiment.
Figure 10B:
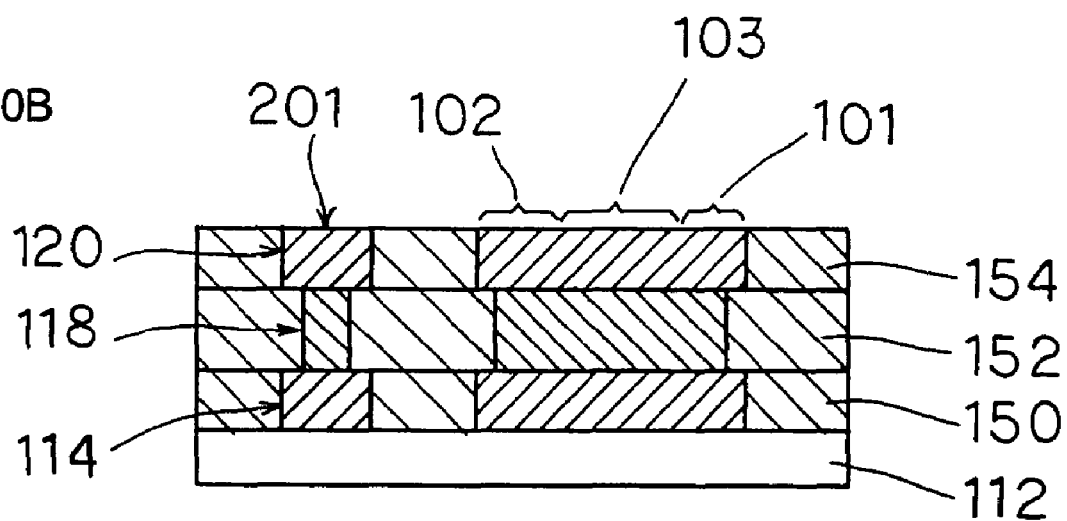

FIGS. 10A and 10B are cross-sectional views of the guard ring assembly shown in FIG. 8B. FIG. 10A is a cross-sectional view taken along line 600a—600a of FIG. 8B, and FIG. 10B is a cross-sectional view taken along line 600b—600b of FIG. 8B.

As shown in FIG. 10A, guard ring 101, guard ring 102, and guard ring 201 have respective guard ring interconnections 114, respective slit via plugs 118, and respective guard ring interconnections 120 which are formed on $SiO_2$ film 112 on a semiconductor substrate (not shown). Slit via plugs 118 are disposed in interlaminar insulating film 152. Guard ring interconnections 114 and guard ring interconnections 120 are connected to each other by slit via plugs 118. Although not shown, SiCN film 136, $SiO_2$ film 126, and SiON film 128 as shown in FIG. 2A are successively disposed on guard ring interconnections 120 as with the first embodiment.

As shown in FIG. 10B, connection 103a comprises guard ring interconnection 114, slit via plug 118, and guard ring interconnection 120 which are successively formed. In the cross-sectional area shown in FIG. 10B, since no connection 203 is present, interlaminar insulating film 150, interlaminar insulating film 152, and interlaminar insulating film 154 are successively formed between guard rings 201, 102. Though not shown, connection 203 has the same cross-sectional structure as connection 103a.

The semiconductor device may have three or more interconnection layers. For example, a cross-sectional structure having four interconnection layers which include two interconnection layers added to the above two interconnection layers will be described below.

Figure 11A:
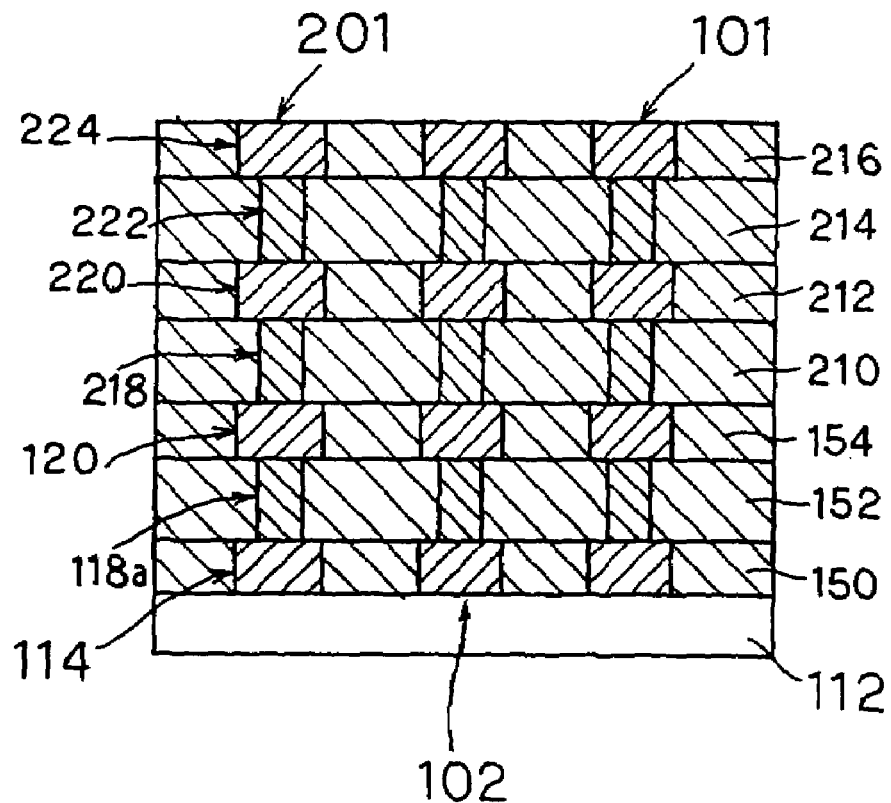
FIGS. 11A and 11B are cross-sectional views of a guard ring assembly, which is incorporated in four-layer interconnections, of the semiconductor device according to the third embodiment.
Figure 11B:
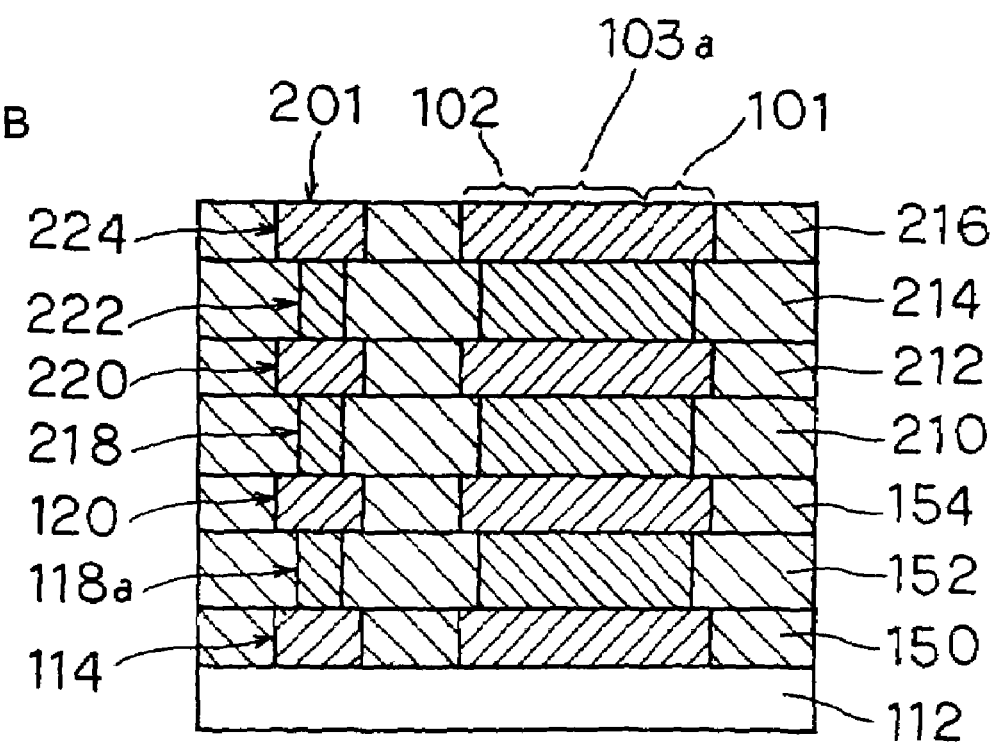

FIGS. 11A and 11B show in cross section a guard ring assembly of the semiconductor device according to the third embodiment, and correspond respectively to FIGS. 10A and 10B.

As shown in FIG. 11A, guard ring 101, guard ring 102, and guard ring 201 have, in addition to the structural details shown in FIG. 10A, respective slit via plugs 218, respective guard ring interconnections 220, respective slit via plugs 222, and respective guard ring interconnections 224 which are successively formed on respective guard ring interconnections 120.

Slit via plugs 218 are formed in interlaminar insulating film 210, and guard ring interconnections 220 are formed in interlaminar insulating film 212. Slit via plugs 222 are formed in interlaminar insulating film 214, and guard ring interconnections 224 are formed in interlaminar insulating film 216. Each of interlaminar insulating films 210, 212, 214, 216 comprises an SiCN film serving as a stopper film for stopping etching and an L-Ox film serving as a low-dielectric-constant film.

As shown in FIG. 11B, connection 103a comprises slit via plug 218, guard ring interconnection 220, slit via plug 222, and guard ring interconnection 224 which are successively formed on guard ring interconnection 120. Connection 103a is integral with guard rings 101, 102. Though not shown, connection 203 has the same cross-sectional structure as connection 103a.

Even if circuit region 100 has three or more interconnection layers, the guard rings and the connections may be formed as described above to prevent water from entering circuit region 100.

The manner in which connections and guard rings are connected in a planar pattern will be described below. As shown in plan in FIGS. 1B, 7B, and 8B, the connections and the guard rings are connected perpendicularly to each other in the above embodiments. However, connections may be connected to guard rings at an angle smaller than 90 degrees, as described below.

Figure 12:
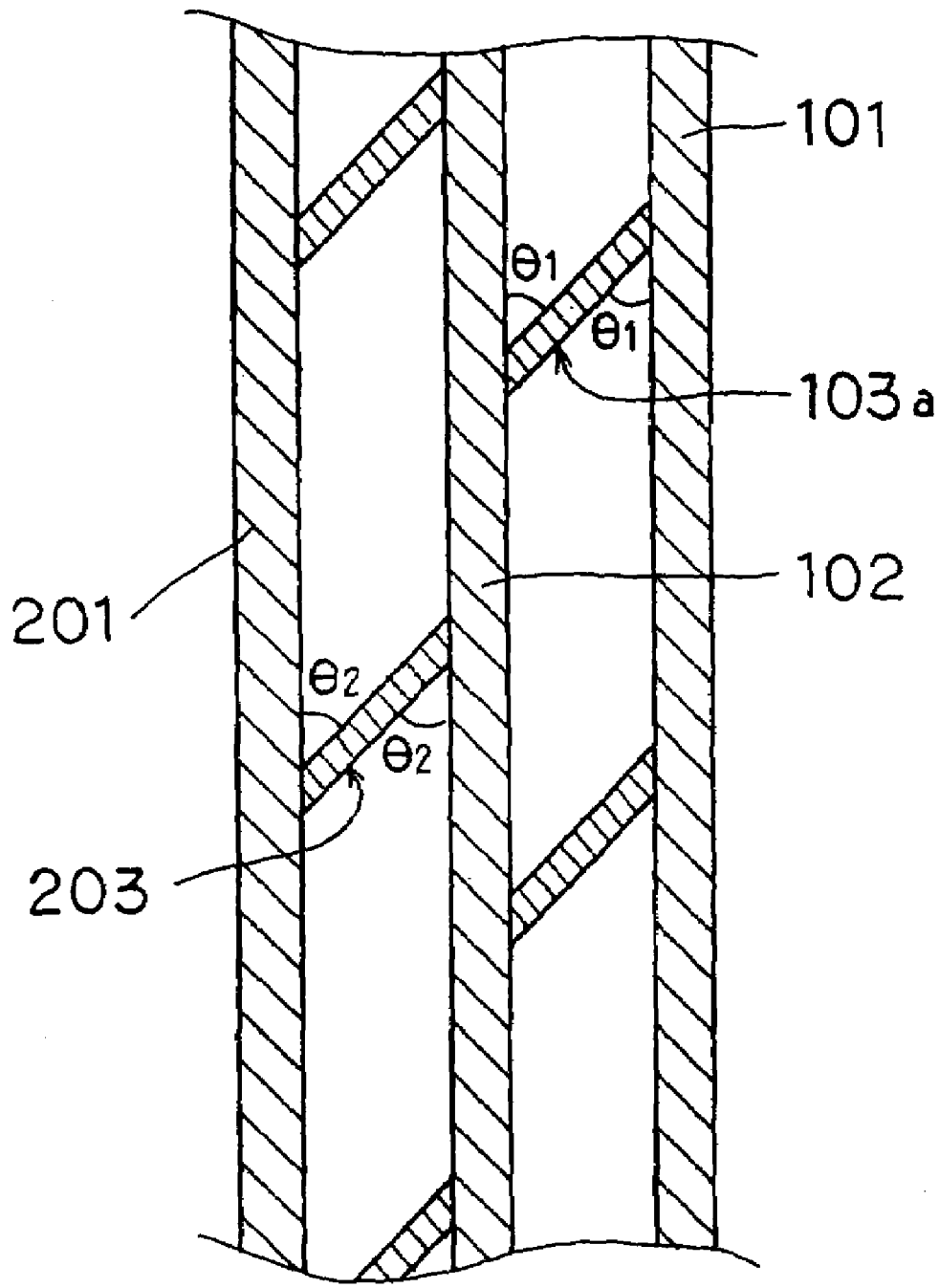
FIG. 12 is a plan view showing a semiconductor device structure wherein connections are obliquely connected to guard rings.

FIG. 12 shows in plan a semiconductor device structure wherein connections are obliquely connected to guard rings.

As shown in FIG. 12, connections 103a are connected to guard rings 101, 102 at an angle $\theta_1$ of 45 degrees. Similarly, connections 203 are also connected to guard rings 101, 102 at an angle $\theta_2$ of 45 degrees. Though the angles $\theta_1$, $\theta_2$ are illustrated as 45 degrees in FIG. 12, they are not limited to 45 degrees.

Even though the connections are obliquely connected to the guard rings, since each of the guard rings is free of junctions where the number of connected linear patterns is 4 or more, the embeddability of a Cu film in junctions is the same as the case with the arrangement shown in FIG. 8B.

In the first through third embodiments, an interlaminar insulating film where interconnections and via plugs are embedded may comprise, other than an oxide film, a low-dielectric-constant film, an SiCN film, an SiN film, an SiON film, or a stacked combination of those films.

In the first through third embodiments, an L-Ox film is used as a low-dielectric-constant film. However, a low-dielectric-constant film may comprise at least either one of an L-Ox film, a hydrogen-containing polysiloxane film, an SiOC film, an SiOF film, an SiC film, and an organic film, or a stacked combination of those films. The organic film may comprise an MSQ (methylsilsesquioxane) film or a BCB (benzoycyclobuten)-based film. A hydrogen-containing polysiloxane is referred to as an HSQ (hydrogensilsesquioxane).

The stopper film for stopping etching is not limited to the SiCN film, but may be an SiN film or an SiC film.

The circuit interconnections and via plugs and the guard ring interconnections and slit via plugs may be made of Cu, aluminum (Al), silver (Ag), gold (Au), or an alloy thereof.

In either the second embodiment or the third embodiment, connections may be disposed at corners of guard rings or the density of connections may be progressively larger toward corners of circuit region 100, as with the first embodiment.

In either the first embodiment or the second embodiment, three or more interconnection layers may be employed, as with the third embodiment.

While preferred embodiments of the present invention have been described using specific terms, such description is for illustrative purposes only, and it is to be understood that changes and variations may be made without departing from the spirit or scope of the following claims.

What is claimed is:

1. A semiconductor device comprising:
    a circuit region on a semiconductor substrate;
    a first guard ring extending into the substrate and surrounding said circuit region;
    a second guard ring extending into the substrate between said circuit region and said first guard ring surrounding said circuit region; and
    first connections extending into the substrate and connecting said first guard ring and said second guard ring to each other and dividing an area sandwiched between said first guard ring and said second guard ring into a plurality of subareas,
    wherein said circuit region has a corner, and said first connections are spaced at a density which is progressively greater toward the corner of said circuit region.

2. A semiconductor device comprising:
    a circuit region on a semiconductor substrate;
    a first guard ring extending into the substrate and surrounding said circuit region;
    a second guard ring extending into the substrate between said circuit region and said first guard ring surrounding said circuit region;
    first connections extending into the substrate and connecting said first guard ring and said second guard ring to each other and dividing an area sandwiched between said first guard ring and said second guard ring into a plurality of subareas;
    a third guard ring disposed between said second guard ring and said circuit region in surrounding relation to said circuit region; and
    second connections connecting said second guard ring and said third guard ring to each other and dividing an area sandwiched between said second guard ring and said third guard ring into a plurality of subareas.

3. A semiconductor device according to claim 2, wherein junctions where said first connections are connected to said second guard ring and junctions where said second connections are connected to said second guard ring are positioned out of alignment with each other.

4. A semiconductor device according to claim 2, wherein said second guard ring, said first connections, and said second connections are connected to each other at junctions where the number of connected linear patterns extending in different directions therefrom is 3.

5. A semiconductor device comprising:
    a circuit region on a semiconductor substrate;
    a first guard ring extending into the substrate and surrounding said circuit region;
    a second guard ring extending into the substrate between said circuit region and said first guard ring surrounding said circuit region; and
    first connections extending into the substrate and connecting said first guard ring and said second guard ring to each other and dividing an area sandwiched between said first guard ring and said second guard ring into a plurality of subareas,
    wherein said circuit region comprises a first insulating film having a dielectric constant lower than an oxide film and a second insulating film stacked on said first insulating film and different in film quality from said first insulating film, and said second guard ring covers sides of said first insulating film and a slit between said first insulating film and said second insulating film.

6. A semiconductor device according to claim 5, wherein said first insulating film comprises at least one of a ladder-type hydrogenated siloxane film, a hydrogen-containing polysiloxane film, an SiOC film, an SiOF film, an SiC film, and an organic film.

7. A semiconductor device according to claim 2, wherein said circuit region has a corner, and said second connections connect a corner of said third guard ring which corresponds to the corner of said circuit region to said second guard ring.

8. A semiconductor device according to claim 2, wherein said circuit region has a corner, and said second connections are spaced at a density which is progressively greater toward the corner of said circuit region.

9. A semiconductor device according to claim 2, wherein said circuit region comprises a first insulating film having a dielectric constant lower than an oxide film and a second insulating film stacked on said first insulating film and different in film quality from said first insulating film, and said third guard ring covers sides of said first insulating film and a slit between said first insulating film and said second insulating film.

10. A semiconductor device according to claim 9, wherein said first insulating film comprises at least one of a ladder-type hydrogenated siloxane film, a hydrogen-containing polysiloxane film, an SiOC film, an SiOF film, an SiC film, and an organic film.

11. A semiconductor device comprising:
    a semiconductor substrate having a circuit region therein;
    an insulating layer on said semiconductor substrate;
    a first guard ring in said insulating layer and surrounding said circuit region;
    a second guard ring in said insulating layer between said circuit region and said first guard ring and surrounding said circuit region; and
    first connections that are in said insulating layer and connecting said first guard ring and said second guard ring to each other to divide an area sandwiched between said first guard ring and said second guard ring into a plurality of subareas.

12. The semiconductor device of claim 11, further comprising a third guard ring between said second guard ring and said circuit region and surrounding said circuit region, and second connections connecting said second guard ring and said third guard ring to each other and dividing an area sandwiched between said second guard ring and said third guard ring into a plurality of subareas.

13. The semiconductor device of claim 10, wherein junctions where said first connections are connected to said second guard ring and junctions where said second connections are connected to said second guard ring are out of alignment with each other.

14. The semiconductor device of claim 10, wherein said second guard ring, said first connections, and said second connections are connected to each other at junctions where the number of connected linear patterns is different directions therefrom is three.

15. A semiconductor device comprising:
    a semiconductor substrate having a circuit region therein;
    a first guard ring surrounding said circuit region;
    a second guard ring between said circuit region and said first guard ring and surrounding said circuit region, said second guard ring being spaced from said first guard ring and not overlapping said first guard ring when viewed from a direction perpendicular to a surface of said substrate; and
    first connections connecting said first guard ring and said second guard ring to each other.

16. The semiconductor device of claim 15, further comprising a third guard ring between said second guard ring and said circuit region and surrounding said circuit region, and second connections connecting said second guard ring and said third guard ring to each other and dividing an area sandwiched between said second guard ring and said third guard ring into a plurality of subareas.

17. The semiconductor device of claim 16, wherein junctions where said first connections are connected to said second guard ring and junctions where said second connections are connected to said second guard ring are out of alignment with each other.

18. The semiconductor device of claim 16, wherein said second guard ring, said first connections, and said second connections are connected to each other at junctions where the number of connected linear patterns is different directions therefrom is three.

* * * * *